(12) United States Patent
Lien et al.

(10) Patent No.: US 7,144,744 B2
(45) Date of Patent: Dec. 5, 2006

(54) MAGNETORESISTIVE RANDOM ACCESS MEMORY DEVICE STRUCTURES AND METHODS FOR FABRICATING THE SAME

(75) Inventors: Mitchell T. Lien, Gilbert, AZ (US); Mark A. Durlam, Chandler, AZ (US); Thomas V. Meixner, Gilbert, AZ (US); Loren J. Wise, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 127 days.

(21) Appl. No.: 10/977,003

(22) Filed: Oct. 27, 2004

(65) Prior Publication Data

US 2006/0088947 A1    Apr. 27, 2006

(51) Int. Cl.
*H01L 21/00* (2006.01)
(52) U.S. Cl. .................. 438/3; 257/E21.665; 365/171; 365/173
(58) Field of Classification Search .................. 438/3; 257/E21.665; 365/171, 173
See application file for complete search history.

(56) References Cited

U.S. PATENT DOCUMENTS

| | | | |
|---|---|---|---|
| 5,734,605 A | 3/1998 | Zhu et al. | |
| 6,174,737 B1 * | 1/2001 | Durlam et al. | 438/3 |
| 6,531,777 B1 | 3/2003 | Woo et al. | |
| 6,633,083 B1 | 10/2003 | Woo et al. | |

* cited by examiner

*Primary Examiner*—George R. Fourson
*Assistant Examiner*—Julio J. Maldonado
(74) *Attorney, Agent, or Firm*—Ingrassia, Fisher & Lorenz

(57) ABSTRACT

Magnetoelectronic memory element structures and methods for making such structures using a barrier layer as a material removal stop layer are provided. The methods comprise forming a digit line disposed at least partially within a dielectric layer. The dielectric material layer overlies an interconnect stack. A void space is etched in the dielectric layer to expose the interconnect stack. A conductive-barrier layer having a first portion and a second portion is deposited. The first portion overlies the digit line and the second portion is disposed within the void space and in electrical communication with the interconnect stack. A memory element layer is formed overlying the first portion and an electrode layer is deposited overlying the memory element layer. The electrode layer and the memory element layer are then patterned and etched.

16 Claims, 7 Drawing Sheets

MAGNETORESISTIVE RANDOM ACCESS MEMORY DEVICE STRUCTURES AND METHODS FOR FABRICATING THE SAME

FIELD OF THE INVENTION

The present invention generally relates to magnetoelectronic devices, and more particularly relates to structures for magnetoresistive random access memory devices and methods for fabricating structures for magnetoresistive random access memory devices that provide for enhanced uniform spacing between a memory element and a digit line.

BACKGROUND OF THE INVENTION

Magnetoelectronic devices, spin electronic devices and spintronic devices are synonymous terms for devices that use the effects predominantly caused by electron spin. Magnetoelectronics effects are used in numerous information devices, and provide non-volatile, reliable, radiation resistant, and high-density data storage and retrieval. Magnetoresistive random access memory (MRAM) devices are well-known magnetoelectronics information devices.

The architecture for MRAM devices is composed of an array of memory cells. Each memory cell comprises a memory element (e.g., a giant magnetoresistance (GMR) element or a magnetic tunnel junction (MTJ) element) in electrical communication with a transistor through an interconnect stack. The memory elements are programmed by the magnetic field created from current-carrying conductors. Typically, two current-carrying conductors, the "digit line" and the "bit line", are arranged in cross point matrix to provide magnetic fields for programming of the memory element. Because the digit line usually is formed underlying the memory element so that the memory element may be magnetically coupled to the digit line, the interconnect stack that couples the memory element to the transistor typically is formed, using standard CMOS processing, offset from the memory element.

The interconnect stack is formed utilizing a number of via and metallization layers. The via that electrically couples the interconnect stack to the memory element often is referred to as the MVia. Present day methods for forming MVias in an MRAM device often produce undesirable results and challenges. For example, often the MVia is connected to the interconnect stack to the transistor by a digit line landing pad, which typically is formed at the same time the digit line is formed. However, the simultaneous formation of the digit line landing pad and the digit line often results in the deposition in the digit line landing pad of cladding material that is used to create the digit line. Cladding material in the digit line landing pad may cause the digit line landing pad to exert undesirable magnetic effects on the memory element.

In addition, in processes in which the digit line is formed before the MVia, the digit line typically is capped with a capping layer that serves to protect the metal of the digit line, usually copper, from diffusing out of the digit line and from subsequent processing steps. Formation of the MVia then may involve the blanket deposition of a barrier layer and copper into a via void space formed in a dielectric material layer in which the digit line is formed. The barrier layer minimizes the diffusion of the copper into the dielectric material layer. After deposition of the barrier layer and the copper into the via void space, any excess barrier layer and copper deposited outside the via void space and overlying the capping layer is removed, typically by a process such as chemical-mechanical polishing, electrochemical-mechanical polishing, or the like. However, such removal processes often result in roughness and non-uniform thickness of the remaining capping layer. Because the distance between the digit line and a memory element subsequently formed overlying the capping layer often is designed to be relatively thin, in the range of about 5 to 1000 angstroms, and uniform, both phenomena may have adverse affects on the formation and/or operation of the subsequently formed memory element.

Further, when copper is deposited into the via void space to form the MVia, a copper capping layer typically is deposited overlying the copper via, and consequently the digit line, to minimize copper diffusion from the via. However, such a capping layer may increases the distance between the digit line and the overlying memory element. In this regard, a relatively larger amount of current may be required to flow through the digit line to program the memory element.

Accordingly, it is desirable to provide a magnetoelectronic memory element structure and a method for fabricating the structure that results in a uniform thickness of material between the digit lines and the overlying memory elements. In addition, it is desirable to provide a magnetoelectronic memory element structure and a method for fabricating the structure that results in a smooth surface upon which a memory element may be deposited. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
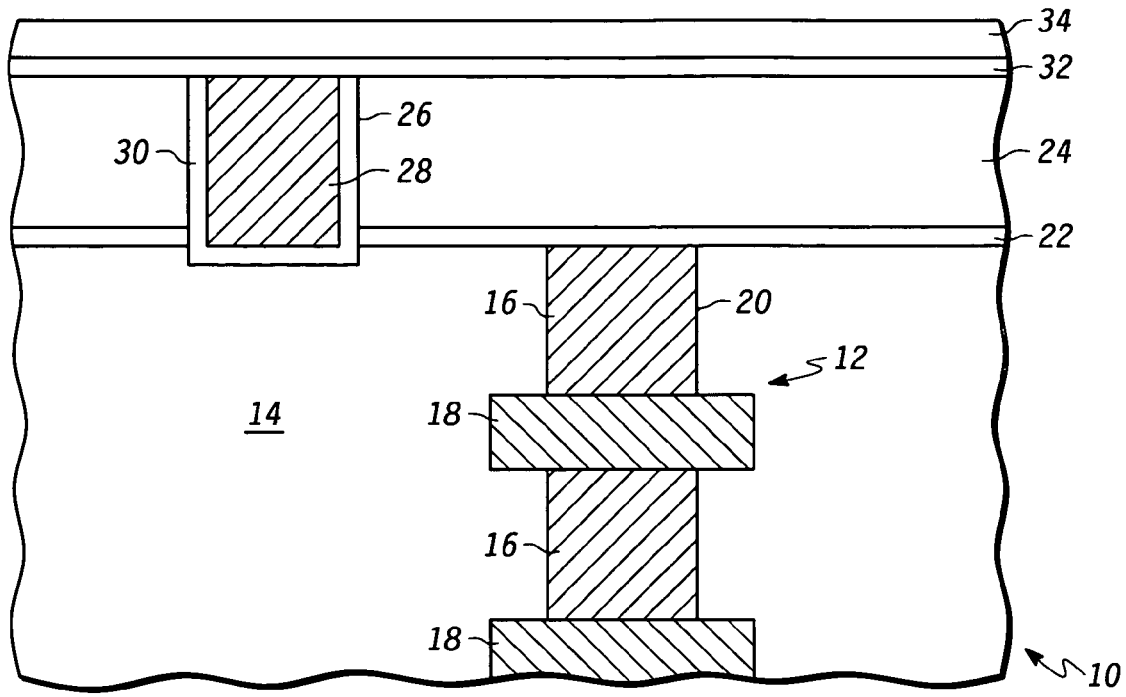
FIGS. 1–6 illustrate schematically, in cross section, a method for fabricating a memory cell structure of an MRAM device in accordance with an exemplary embodiment of the present invention.

Turning now to the figures, FIGS. 1–6 illustrate a method in accordance with one exemplary embodiment of the present invention for fabricating an MRAM device structure, the method utilizing a barrier layer as a planarization stop layer. FIG. 1 is a cross-sectional view of a memory cell 10 of a partially fabricated array of an MRAM device. For ease of discussion, only one memory cell 10 of an MRAM device is illustrated. However, it will be understood that the MRAM device may be formulated with a plurality of memory cells 10. In accordance with a standard and well known CMOS process, an interconnect stack 12 of vias 16 and metallization layers 18 is formed in the line and stack formation overlying a substrate (not shown), and typically within one or more dielectric materials 14, to provide the interconnections for the memory device array in which memory cell 10 is included. As used herein, the term "layer" means one layer or a combination or plurality of sub-layers. Interconnect stack 12 is formed by providing dielectric layering, masking and etching, and metal deposition all in a well-known manner. The last segment of the interconnect stack 12, identified herein as a "bottom" via 20, or "BVia", is capped by a via, identified herein as a "memory" via or "MVia, which is electrically connected to the memory cell, as discussed in more detail below.

Memory cell 10 further may comprise a first capping layer 22, which has been deposited overlying BVia 20 to minimize the diffusion of metal, preferably copper, from the via. A first dielectric material layer 24 may be disposed overlying first capping layer 22 and/or the dielectric material(s) 14 and BVia 20. First dielectric material layer 24 may comprise any suitable dielectric material such as, for example, tetraethyl orthosilicate-derived silicon dioxide (TEOS), fluorinated tetraethyl orthosilicate-derived silicon dioxide (FTEOS), plasma-enhanced nitride (PEN), fluorinated glass, spin-on-glass, hydrogen silsesquioxane, methyl silsesquioxane, silicon nitride, silicon dioxide, and the like. A digit line 26 then may be formed using any suitable well-known process, such as a damascene process, a subtractive process, or any other suitable process, so as to be at least partially disposed within first dielectric material layer 24. Digit line 26 is fabricated to extend perpendicular to the plane of FIG. 1 and typically is formed of any suitable electrically conductive material or materials, referred to herein as a first conductive material 28, such as aluminum (Al), aluminum alloys, copper (Cu) and copper alloys. Preferably, first conductive material 28 comprises copper.

In one embodiment of the invention, a cladding and/or barrier layer(s) 30 of material may be deposited prior to deposition of first conductive material 28. A cladding layer serves to focus the magnetic flux generated when a current is applied to digit line 26. A barrier layer(s) serves to improve adhesion of first conductive material 28 and acts as a barrier against diffusion of first conductive material 28 and the cladding layer material. A barrier layer may comprise tantalum (Ta), tantalum nitride (TaN), or any other suitable materials. A cladding material may comprise a nickel-iron alloy or other similar material having high permeability.

After formation of digit line 26, a second capping layer 32 may be deposited overlying digit line 26 and first dielectric material layer 24 using any suitable conventional deposition process. Second capping layer may comprise any suitable material that may serve as a barrier to diffusion of the material of digit line 26 and that protects the material from subsequent processing. Examples of such materials include plasma enhanced nitride (PEN), silicon nitride ($Si_3N_4$), aluminum nitride (AlN), silicon oxide nitride ($SiO_xN_y$), or any other suitable material. A second dielectric material layer 34 optionally may be deposited overlying second capping layer 32. Second dielectric material layer 34 may be formed of any of the materials described above for forming first dielectric material layer 24. Capping layer 32 and, optionally, second dielectric material layer 34 may have any thickness that is suitable for protecting the material in digit line 26 and minimizing the diffusion thereof. Preferably, however, the thickness of capping layer 32, and optional second dielectric material layer 34, is optimized so that the distance between digit line 26 and a memory element subsequently formed overlying digit line 26 is minimized and is substantially uniform.

Figure 2:
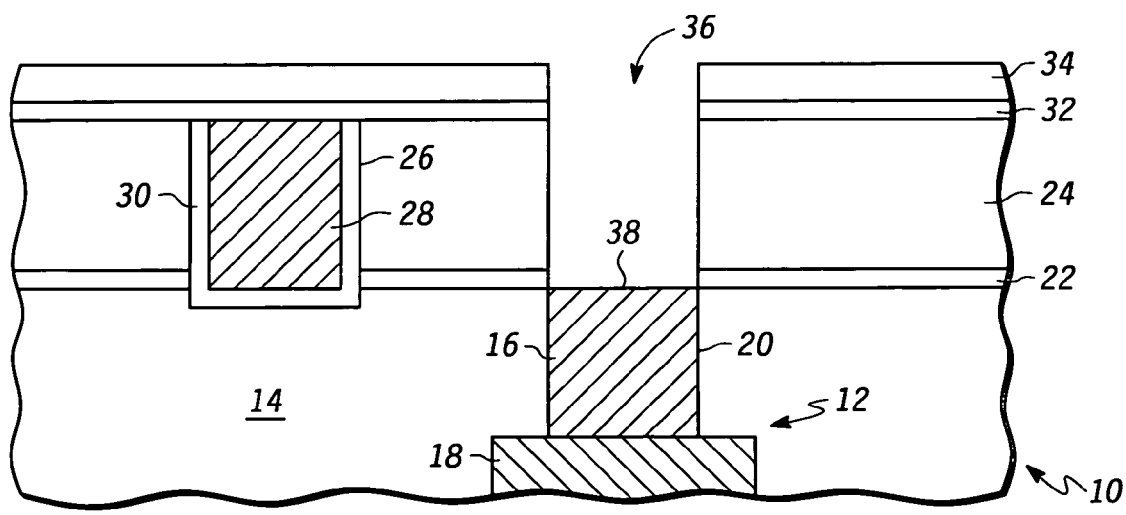
Figure 3:
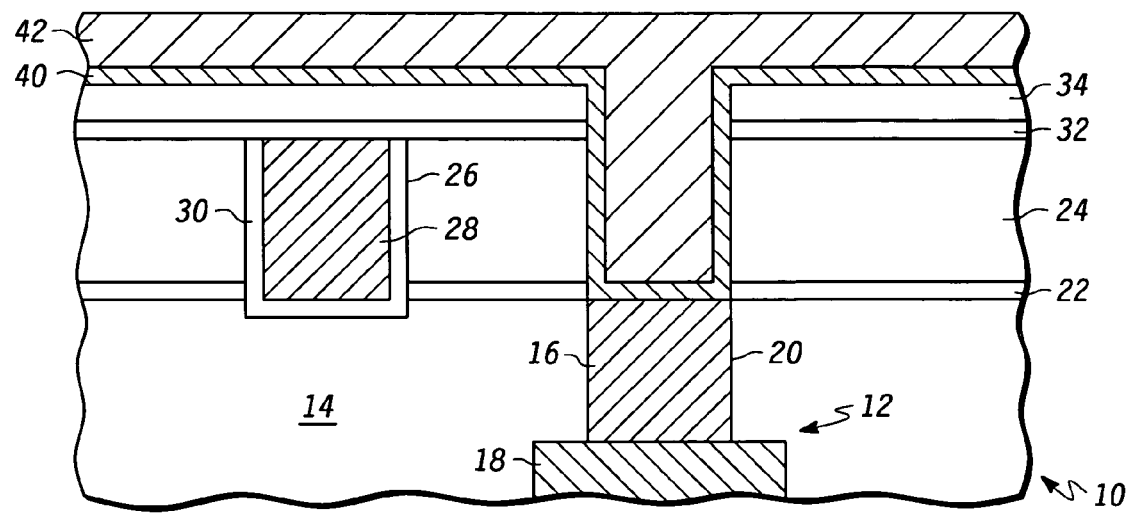

Referring now to FIG. 2, second dielectric material 34, second capping layer 32, first dielectric material layer 24, and first capping layer 22 are suitably patterned and etched using standard masking and etching techniques to form a via void space 36 overlying interconnect stack 12 and exposing a surface 38 of interconnect stack 12. As illustrated in FIG. 3, a barrier layer 40 is deposited by a blanket deposition overlying second capping layer 32, and optional second dielectric material layer 34, and within via void space 36. A second conductive material 42 then is deposited by blanket deposition to fill via void space 36. The second conductive material 42 may comprise any suitable conductive material, such as a metal or combinations or layers of various metals, and preferably comprises copper. The barrier layer 40 serves to improve the adhesion of the second conductive material 42 within the via void space 36 and also acts as a barrier against diffusion of the second conductive material. The barrier layer 40 may comprise any conductive material suitable for forming a barrier layer, such as, for example, tantalum (Ta), tantalum nitride (TaN), titanium (Ti), titanium nitride (TiN), tungsten (W), tungsten nitride (WN), or a combination of layers of such materials, such as layers of TaN and Ta. In addition, the barrier layer 40 is sufficiently thick so that barrier layer 40 serves as a barrier to diffusion of the second conductive material 42; however, because the portion of the barrier layer 40 overlying digit line 26 is not subsequently removed, as discussed in more detail below, preferably the thickness of the barrier layer 40 is minimized to minimize the distance between digit line 26 and a subsequently-formed memory element, also discussed in more detail below. In one embodiment of the invention, barrier layer 40 has a thickness in the range of from about 5 nm to about 100 nm. In a preferred embodiment of the invention, barrier layer 40 has a thickness in the range of from about 20 nm to about 50 nm.

Figure 4:
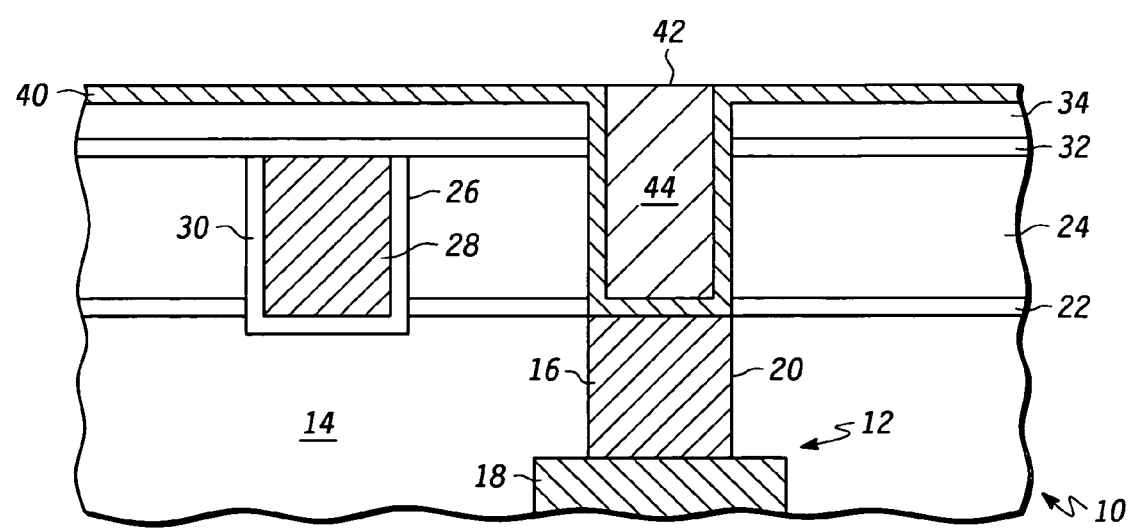

Referring to FIG. 4, after deposition of second conductive material 42, any excess second conductive material 42 overlying barrier layer 40, second capping layer 32, and optional second dielectric material 34 may be removed by any suitable technique, such as chemical mechanical polishing (CMP), electrochemical mechanical polishing (ECMP), etching, and the like, to form MVia 44. In addition to serving as a barrier layer, as described above, barrier layer 40 serves as a stop layer for the removal process. In one embodiment of the present invention, the chemistry of the slurry, etchant, or other removal fluid used to remove second conductive material 42 may be formulated to provide selectivity for the barrier layer 40. Formulating removal fluids to have desired selectivities is well known in the semiconductor industry and will not be discussed further. Accordingly, when the second conductive material 42 comprises copper, the removal fluid may be formulated to cause removal of the copper at a higher rate than removal of the barrier layer. In another embodiment of the invention, the barrier layer 40 may be formed of a material that provides an endpoint signal for stopping or slowing the removal process. Accordingly, the removal process may be terminated when substantially all the excess copper overlying second capping layer 32, and optional second dielectric material 34, is removed while leaving the barrier layer 40 substantially intact. In addition to serving as a removal stop layer, the barrier layer 40 provides a substantially planar surface upon which a memory element may be subsequently deposited, as discussed in more detail below.

Figure 5:
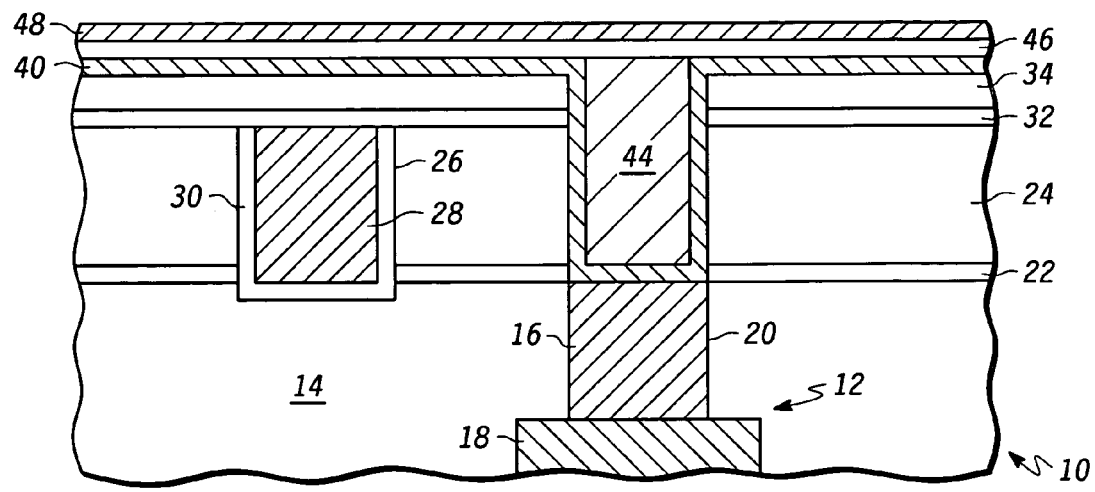

Turning to FIG. 5, after removal of the excess second conductive material 42, a memory element layer 46 may be deposited by blanket deposition overlying the barrier layer 40 and MVia 44. Memory element layer 46 may comprise material layers that form a memory element, such as an MJT element, a GMR element, a magnetic sensor, or the like. For ease of description, memory element layer 46 will be described with reference to the formation of an MJT element. Particularly, memory element layer 46 may comprise a first magnetic layer and a second magnetic layer that both utilize magnetic material such as cobalt iron (CoFe), nickel iron (NiFe) or nickel iron cobalt (NiFeCo). The first magnetic layer serves as a hard magnetic layer, magnetization in which is pinned or fixed, whereas magnetization directions in the second magnetic layer are free to be switched between two magnetic states. A tunnel barrier layer sandwiched between the first and second magnetic layers employs a non-conductive, non-magnetic material, such as, for example, aluminum oxide. In addition, the memory element layer 46 may comprise one or more conductive material layers that are adjacent the magnetic layers and that function as a conductive electrode for the subsequently formed memory element.

An electrode layer 48 is deposited overlying memory element layer 46. Electrode layer 48 typically has a thickness in the range of about 100 to about 4000 angstroms. Electrode layer 48 can be formed of any suitable electrically conductive materials. Preferably, electrode layer 48 is formed of Ta, W, Ti, Al, TaN or combinations or alloys thereof. More preferably, electrode layer 48 is formed of Ta.

Figure 6:
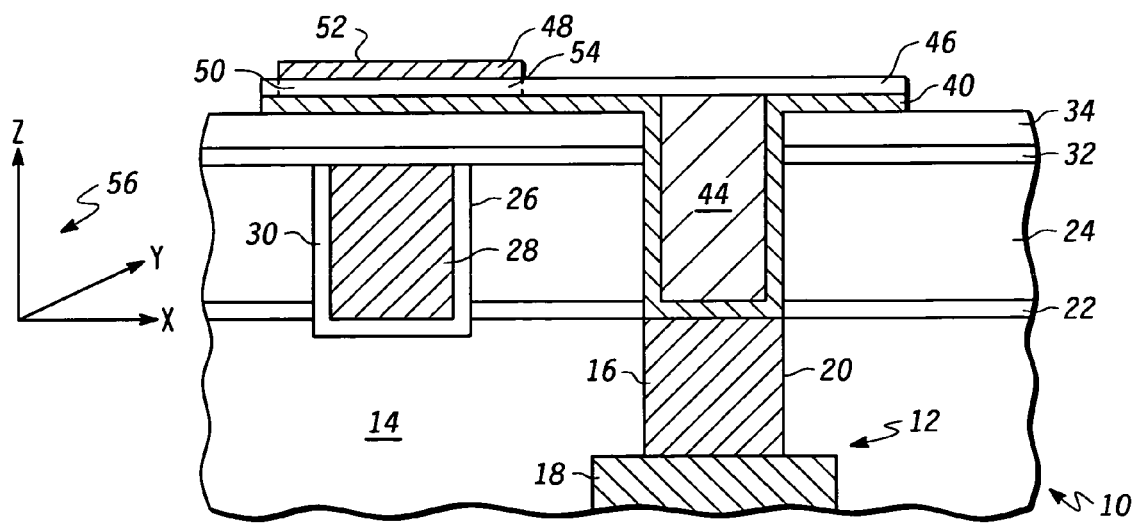

Referring to FIG. 6, electrode layer 48 then may be patterned and etched using standard and well-known mask and etch techniques to form an electrode 52. Electrode 52 has lateral dimensions that define the lateral dimensions of an active region 54 of memory element layer 46. As used herein, the term "lateral dimensions" are those dimensions measured by x and y axes of a coordinate system 56 of FIG. 6. Accordingly, as illustrated in FIG. 6, memory element 50 is formed overlying digit line 26 and underlying electrode 52. The layers disposed between digit line 26 and memory element 50, that is, barrier layer 40, optional dielectric material layer 34, and second capping layer 32, have thicknesses that do not substantially interfere with the magnetic coupling of memory element 50 and digit line 26. It will be appreciated that, in this embodiment, the barrier layer 40 can function as a bottom or underlying electrode for memory element 50.

Memory element layer 46 and barrier layer 40 also may be patterned and etching using standard mask and etch techniques. In a preferred embodiment of the invention, memory element layer 46 and barrier layer 40 are patterned and etched after the formation of electrode 52. However, it will be understood that electrode 52 may be formed after the patterning and etching of memory element layer 46 and barrier layer 40, although it will be appreciated that the patterning and etching of memory element layer 46 and barrier layer 40 may include an initial, simultaneous patterning and etching of electrode layer 48. As illustrated in FIG. 6, memory element layer 46 may be etched so that it substantially covers MVia 44. In this regard, memory element layer 46 serves as a capping layer to minimize the diffusion of second conductive material 42 from MVia 44 and also to protect the conductive material in MVia 44 from corrosive fluids that may be used in subsequent etching processes. In a preferred embodiment of the invention, memory element layer 46 completely covers MVia 44 and extends sufficiently beyond MVia 44 to allow for any misalignments that may result during patterning or during subsequent etching processes.

It will be appreciated that, in this embodiment, optional second dielectric material layer 34, or second capping layer 32 when optional second dielectric material layer 34 is not present, may be formulated to serve as an etch stop when barrier layer 40 is subjected to standard etching techniques. For example, second dielectric material 34 layer, or second capping layer 32, may be formed of a material that is selective to a particular etch chemistry, or second dielectric material layer 34, or second capping layer 32, may be formed of a material that provides an endpoint signal for stopping or slowing the etch process. In this regard, second dielectric material layer 34, or second capping layer 32, may protect digit line 26 or any other device or layer underlying optional second dielectric material layer 34 and second capping layer 32 from the etch process.

It also will be appreciated that the various embodiments of the present invention take advantage of the presence of the conductive barrier layer by utilizing the barrier layer as a bottom electrode for an overlying memory element. In addition, if the relatively thin barrier layer is not removed but is used as a removal stop layer, the need for a thick dielectric material layer within which the removal process is terminated is not required. In this regard, the memory element may be fabricated in closer proximity to the digit line than would be possible if a thicker dielectric material layer were present. A digit line fabricated with smaller dimensions permits the fabrication of an MVia with smaller dimensions and, thus, with an improved aspect ratio. Further, the second capping layer 32 and optional second dielectric material layer 34 can be fabricated as thin and as uniform as deposition process parameters permit. This may result in improved magnetic memory element switching distribution within the MRAM device and may permit the memory cell to be scalable to future smaller geometries and spacing.

Figure 7:
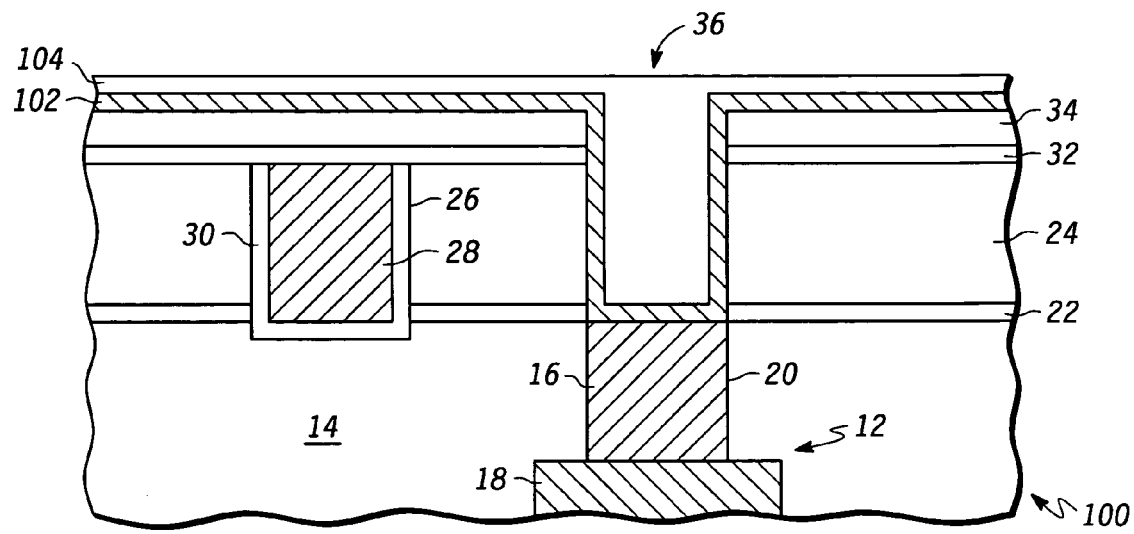
FIGS. 7–9 illustrate schematically, in cross section, a method for fabricating a memory cell structure of an MRAM device in accordance with another exemplary embodiment of the present invention.
Figure 8:
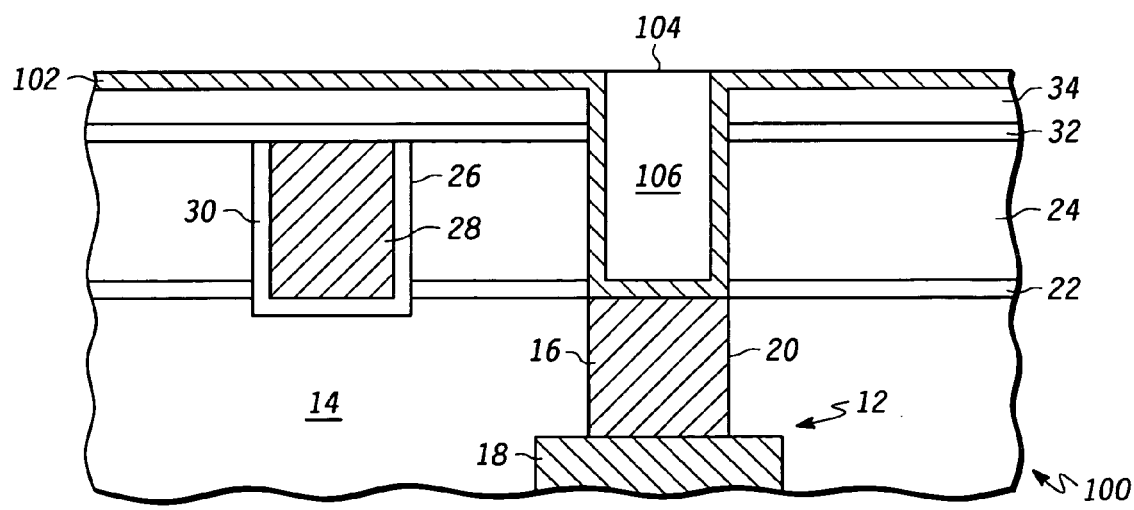
Figure 9:
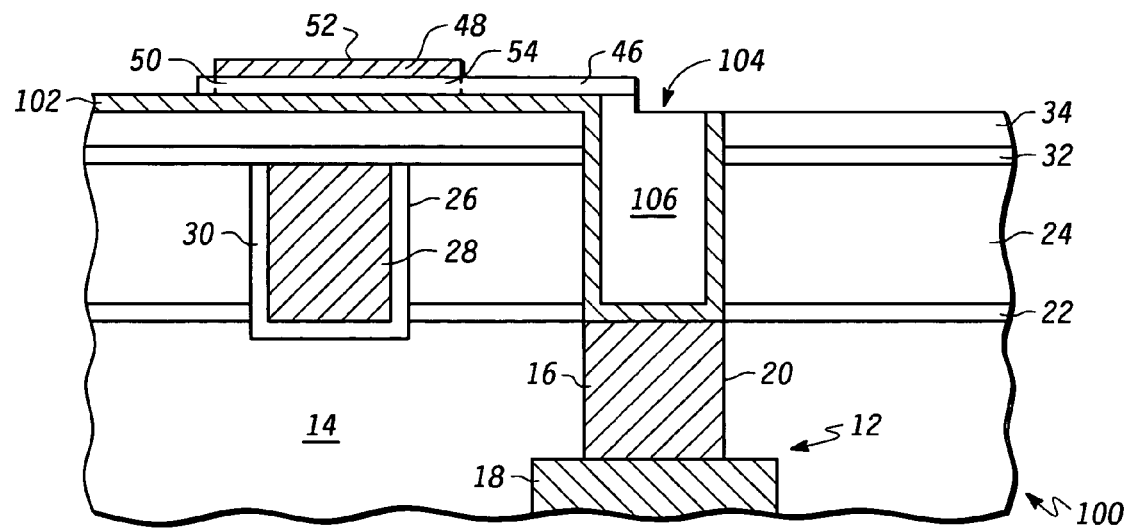

FIGS. 7–9 illustrate a method for fabricating a magnetoelectronic memory element structure in accordance with another embodiment of the present invention. The method begins with the steps discussed above with reference to FIGS. 1 and 2, such that a memory cell 100 with a via void space 36 is formed. For ease of discussion, only one memory cell 100 of an MRAM device is illustrated in FIGS. 7–9. However, it will be understood that the MRAM device may be formulated with a plurality of memory cells 100. Memory cell 100 is similar to memory cell 10, with like reference numbers referring to like elements.

Referring now to FIG. 7, after formation of via void space 36, a conductive barrier layer 102 is deposited by a blanket deposition overlying second capping layer 32 and optional second dielectric material layer 34 and within via void space 36. The barrier layer 102 may comprise any conductive material suitable for forming a barrier layer, such as, for example, tantalum (Ta), tantalum nitride (TaN), titanium (Ti), titanium nitride (TiN), tungsten (W), tungsten nitride (WN), or a combination of layers of such materials, such as layers of TaN and Ta. In addition, the barrier layer 102 may have any suitable thickness, which may or may not be dependent on the material used to form barrier layer 102; however, because the portion of the barrier layer 102 overlying digit line 26 is not subsequently removed, as discussed in more detail below, preferably the thickness of the barrier layer 102 is minimized to minimize the distance between digit line 26 and a subsequently formed memory element, also discussed in more detail below.

A fill material 104 then may be deposited globally to fill via void space 36. Fill material 104 may comprise any suitable material, combination of materials, or layers of materials, that does not require use of a capping layer to prevent diffusion and/or to prevent corrosion or degradation of the fill material from subsequent processing. In one embodiment of the invention, fill material 104 may be formed from a dielectric material, such as, for example, TEOS, high density plasma TEOS (HDPTEOS), boron phosphorus doped TEOS (BPTEOS), boron phosphorus silica glass (BPSG), spin-on-glass, plasma-enhanced nitride (PEN), fluorinated glass, hydrogen silsesquioxane, methyl silsesquioxane, silicon nitride, silicon dioxide, and the like, or combinations thereof. In another embodiment of the invention, fill material 104 may comprise a metal, such as tungsten, that does not require a capping layer to prevent diffusion and/or degradation caused from subsequent processing.

Turning to FIG. 8, after deposition of fill material 104, any excess fill material 104 overlying barrier layer 102, second capping layer 32, and optional second dielectric material 34 may be removed by any suitable technique, such as CMP, ECMP, etching, and the like, to form MVia 106. As described above for barrier layer 40, barrier layer 102 serves as a stop layer for the removal process. In one embodiment of the present invention, the chemistry of the slurry, etchant, or other removal fluid used to remove fill material 104 may be formulated to provide selectivity for the barrier layer 102. Formulating removal fluids to have desired selectivities is well known in the semiconductor industry and will not be discussed further. Accordingly, when the fill material 104 comprises a dielectric, the removal fluid may be formulated to cause removal of the dielectric at a higher rate than removal of the barrier layer 102. In another embodiment of the invention, the barrier layer 102 may be formed of a material that provides an endpoint signal for stopping or slowing the removal process. Accordingly, the removal process may be terminated when substantially all of the excess fill material 104 overlying second capping layer 32, and optional second dielectric material 34, is removed while leaving the barrier layer 102 substantially intact. In addition to serving as a removal stop layer, the barrier layer 102 provides a substantially planar surface upon which additional material layers may be subsequently deposited.

Referring now to FIG. 9, after removal of the excess fill material 104, memory element layer 46 may be deposited by blanket deposition overlying the barrier layer 102 and MVia 106. An electrode layer 48 may be deposited overlying memory element layer 46. Suitable materials for electrode layer 48 and memory element layer 46 are as discussed previously. Electrode layer 48 then may be patterned and etched using standard mask and etch techniques to form electrode 52. Accordingly, as illustrated in FIG. 9, a memory element 50, defined by active region 54 of memory element layer 46, is formed overlying digit line 26 and underlying electrode 52. The layers disposed between digit line 26 and memory element 50, that is, barrier layer 102, optional dielectric material layer 34, and second capping layer 32, have thicknesses that do not substantially interfere with the magnetic coupling of memory element 50 and digit line 26. It will be appreciated that, in this embodiment, the barrier layer 102 can function as a bottom or underlying electrode for memory element 50.

Memory element layer 46 then may be patterned and etching using standard mask and etch techniques. Barrier layer 102 also may be patterned and etched during the patterning and etching of memory element layer 46. In a preferred embodiment of the invention, memory element layer 46, and optionally barrier layer 102, are patterned and etched after the patterning and etching of electrode layer 48. However, it will be understood that electrode 52 may be formed after the patterning and etching of memory element layer 46 and barrier layer 102, although it will be appreciated that the patterning and etching of memory element layer 46 may include an initial, simultaneous patterning and etching of electrode layer 48. As illustrated in FIG. 9, because fill material 104 does not require a capping layer, memory element layer 46 does not necessarily have to be etched so that it substantially covers or even partially covers MVia 106. In this regard, memory cell 100 may have smaller lateral dimensions than if memory element layer 46 were used as a capping layer for MVia 106 and, accordingly, extended from memory element 50 over MVia 106 and beyond Mvia 106 to allow for misalignments during patterning or subsequent etching. In addition, electrode 52, and hence memory element 50, may have larger lateral dimensions without increasing the lateral dimensions of memory cell 100 because real estate overlying barrier layer 102 is not required to support a memory element layer or other capping layer that must extend beyond MVia 106 to protect MVia 106.

Figure 10:
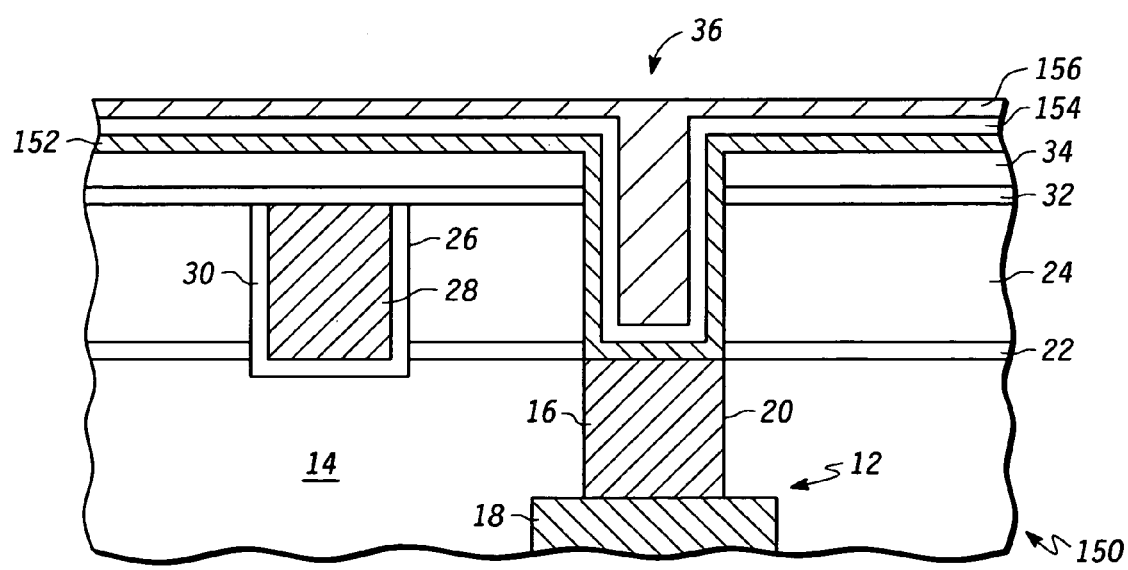
FIGS. 10–11 illustrate schematically, in cross section, a method for fabricating a memory cell structure of an MRAM device in accordance with a further exemplary embodiment of the present invention.
Figure 11:
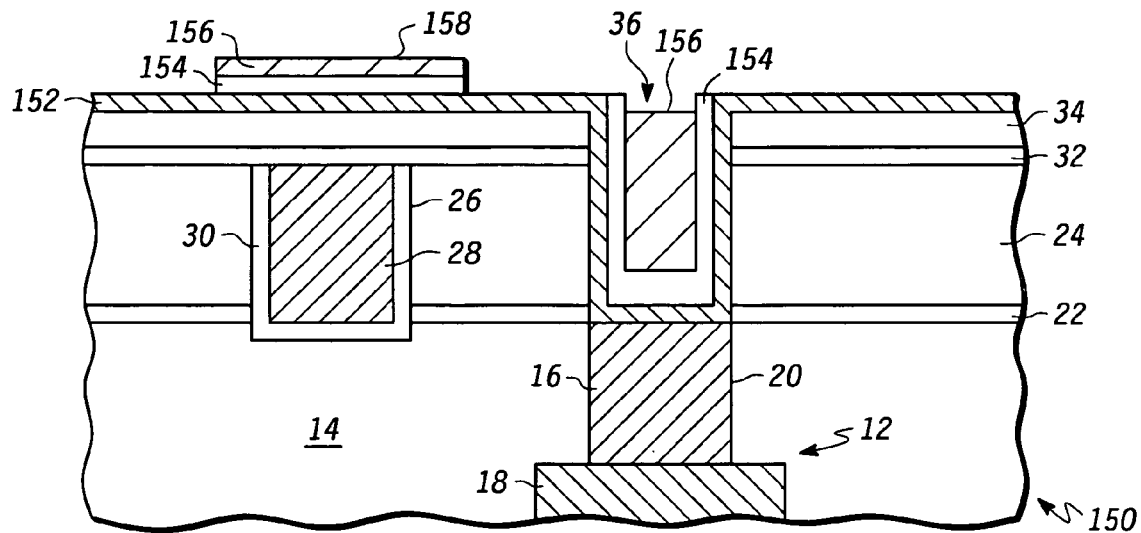

FIGS. 10 and 11 illustrate a method for fabricating a magnetoelectronic memory element structure in accordance with a further embodiment of the present invention. The method begins with the steps discussed above with reference to FIGS. 1 and 2, such that a memory cell 150 is formed with a via void space 36. For ease of discussion, only one memory cell 150 of an MRAM device is illustrated in FIGS. 10–11. However, it will be understood that the MRAM device may be formulated with a plurality of memory cells 150. Memory cell 150 is similar to memory cell 10, with like reference numbers referring to like elements.

Referring now to FIG. 10, after formation of via void space 36, a conductive barrier layer 152 is deposited by a blanket deposition overlying second capping layer 32 and optional second dielectric material layer 34 and within via void space 36. The barrier layer 152 may comprise any of the conductive materials and have any suitable thickness as described above for the formation of barrier layer 40 of FIG. 3 or barrier layer 102 of FIG. 7.

A memory element layer 154 then may be deposited by blanket deposition overlying the barrier layer 152 and within via void space 36. Memory element layer 154 may comprise any of the structures and any of the materials described above for memory element layer 46 of FIG. 5. An electrode layer 156 then may be deposited overlying memory element layer 154. Electrode layer 156 may be formed of any of the materials and have any thickness suitable for forming electrode layer 48, described above with reference to FIG. 5.

Electrode layer 156 then is patterned and etched using standard mask and etch techniques so that, as illustrated in FIG. 11, an electrode 158 is formed. Memory element layer 154 also is patterned and etched using standard mask and etch techniques. In a preferred embodiment of the invention, memory element layer 154 is patterned and etched after the patterning and etching of electrode layer 156. However, it will be understood that electrode layer 156 alternatively may be patterned and etched after the patterning and etching of memory element layer 154, although it will be appreciated that the patterning and etching of memory element layer 154 may include an initial, simultaneous patterning and etching of electrode layer 156. A portion of the materials that fill via void space 36 may be removed during etching of electrode layer 156 and/or memory element layer 154 but such etching preferably does not remove all materials in via void space 36. In this regard, BVia 20 is not exposed and remains protected by the materials in via void space 36 that remain after etching.

It will be appreciated that, in this exemplary embodiment of the invention, a separate removal step to remove conductive or fill material deposited overlying barrier layer 152 is not utilized. Instead, this is done simultaneously with patterning of electrode layer 156 and/or memory element layer 154. Accordingly, by elimination of a removal step, fabrication of memory cell 150 may be simplified and throughput may be increased. In addition, it will be appreciated that, because material within via void space 36 does not require a capping layer, memory element layer 154 does not necessarily have to be etched so that it substantially covers the material in via void space 36 and extends beyond via void space 36 to allow for misalignment during patterning or subsequent etchings. In this regard, memory cell 150 may have smaller lateral dimensions than if memory element layer 154 were used as a capping layer for the materials within via void space 36.

Figure 12:
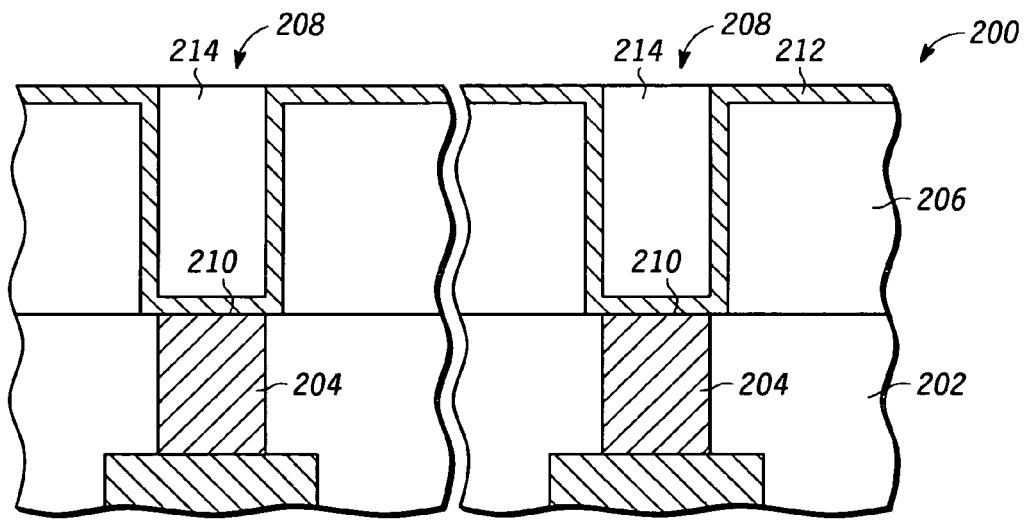
FIG. 12 is a cross sectional view of a semiconductor structure in accordance with a exemplary embodiment of the present invention.

It will be understood that the principles of the present invention are not limited to magnetoelectronics structures but may also be used for other semiconductor device structures that utilize a barrier layer for an additional purpose. For example, in accordance with an exemplary embodiment of the present invention, FIG. 12 illustrates an electronic structure 200, which may comprise a precision resistor, a local interconnect structure, or the like, formed using the various embodiments of the methods described above. Electronic structure 200 comprises a first dielectric material layer 202, or combination of dielectric material layers, within which has been formed at least two interconnect stacks 204. A second dielectric material layer 206 overlies first dielectric material layer 202. Void spaces 208 are formed within second dielectric material layer 206 to expose a surface 210 of interconnect stacks 204. Void spaces 208 may be any suitable void space, such as, for example, vias or trenches.

A barrier layer 212 is deposited by blanket deposition within void spaces 208 and overlying second dielectric material layer 206 to any suitable thickness. The barrier layer 212 may comprise any conductive material suitable for forming a barrier layer, such as, for example, tantalum (Ta), tantalum nitride (TaN), titanium (Ti), titanium nitride (TiN), tungsten (W), tungsten nitride (WN), or a combination of layers of such materials, such as layers of TaN and Ta. In addition, the barrier layer 212 may have any thickness suitable for a particular application, which thickness may or may not be dependent on the material used to form barrier layer 212.

In one embodiment of the invention, a fill material 214 then may be deposited by blanket deposition overlying barrier layer 212 to fill void spaces 208. Fill material 214 may comprise any material suitable for a desired application. In one embodiment of the invention, fill material 214 may comprise a conductive material, such as copper or tungsten, so that fill material 214 in void spaces 208 functions as a conductor. In another embodiment of the invention, fill material 214 may be formed from a dielectric material, such as, for example, TEOS, high density plasma TEOS (HDP-TEOS), boron phosphorus doped TEOS (BPTEOS), boron phosphorus silica glass (BPSG), spin-on-glass, plasma-enhanced nitride (PEN), fluorinated glass, hydrogen silsesquioxane, methyl silsesquioxane, silicon nitride, silicon dioxide, and the like, or combinations thereof. In yet another embodiment of the invention, void spaces 208 are not wholly or partially filled with a fill material but, rather, are filled with any other materials that are subsequently deposited overlying barrier layer 212. Accordingly, in these embodiments, barrier layer 212 may serve as a resistor between two interconnect stacks 204 or as a local interconnect to electrically couple interconnect stack 204.

Figure 13:
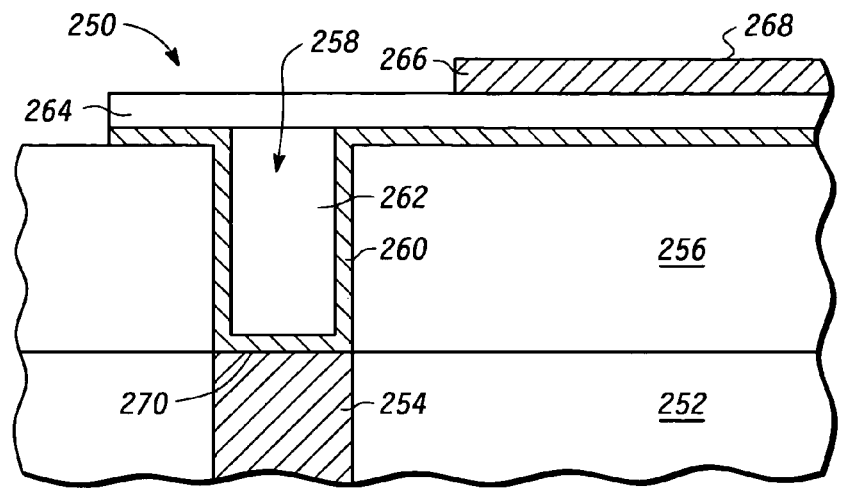
FIG. 13 is a cross sectional view of a metal-insulator-metal structure in accordance with an exemplary embodiment of the present invention.

In accordance with another exemplary embodiment of the present invention, FIG. 13 illustrates an electronic structure 250, which may comprise a metal-insulator-metal (MIM) capacitor formed using the various embodiments of the method described above. Electronic structure 250 comprises a first dielectric material layer 252, or combination of dielectric material layers, within which has been formed a via of an interconnect stack, a metal interconnect line, or any other suitable conductor 254. A second dielectric material layer 256 overlies first dielectric material layer 252. A via void space 258 is formed within second dielectric material layer 256 to expose a surface 270 of conductor 254.

A barrier layer 260 is deposited by blanket deposition within via void space 258 and overlying second dielectric material layer 256 to any suitable thickness. The barrier layer 260 may comprise any conductive material suitable for forming a barrier layer, such as, for example, tantalum (Ta), tantalum nitride (TaN), titanium (Ti), titanium nitride (TiN), tungsten (W), tungsten nitride (WN), or a combination of layers of such materials, such as layers of TaN and Ta. In addition, the barrier layer 260 may have any suitable thickness, which thickness may or may not be dependent on the material used to form barrier layer 260.

In one embodiment of the invention, a fill material 262 then is deposited by blanket deposition overlying barrier layer 260 to fill via void space 258. Fill material 262 may comprise any suitable material. In one embodiment of the invention, fill material 262 may comprise a conductive material, such as copper or tungsten, so that fill material 262 in via void spaces 258 functions as a conductor. In another embodiment of the invention, fill material 262 may be formed from a dielectric material, such as, for example, TEOS, high density plasma TEOS (HDPTEOS), boron phosphorus doped TEOS (BPTEOS), boron phosphorus silica glass (BPSG), spin-on-glass, plasma-enhanced nitride (PEN), fluorinated glass, hydrogen silsesquioxane, methyl silsesquioxane, silicon nitride, silicon dioxide, and the like, or combinations thereof. After deposition of fill material 262, any excess fill material 262 overlying barrier layer 260 and second dielectric material layer 256 may be removed by any suitable removal process, such as CMP, ECMP, etching and the like. As described with reference to barrier layer 40 of FIG. 4, barrier layer 260 serves as a stop layer for the removal process. An insulator material layer 264 then may be deposited by blanket deposition overlying barrier layer 260 and a conductive electrode material layer 266 may be deposited overlying insulator material layer 264. In another embodiment of the invention, via void space 258 is not filled with a fill material but, rather, after deposition of barrier layer 260, insulator material layer 264 is deposited by blanket deposition overlying barrier layer 260 and within via void space 258, followed by deposition of conductive electrode material layer 266.

The conductive electrode material layer 266 then may be patterned and etched to form an electrode 268. Insulator material layer 264 and, optionally, barrier layer 260 also may be patterned and etched, simultaneously or separately, using standard mask and etch techniques. In one embodiment of the invention, insulator material layer 264 may be patterned and etched such that it serves as a capping layer for fill material 262 within via void space 258. In another embodiment of the invention, insulator material layer 264 may be patterned and etched so that it does not extend over fill material 262 or only partially extends over fill material 262. As illustrated in FIG. 13, barrier layer 260 may serve as an underlying conductive electrode for MIM structure 250 while also electrically coupling MIM structure 250 to conductor 254.

Figure 14:
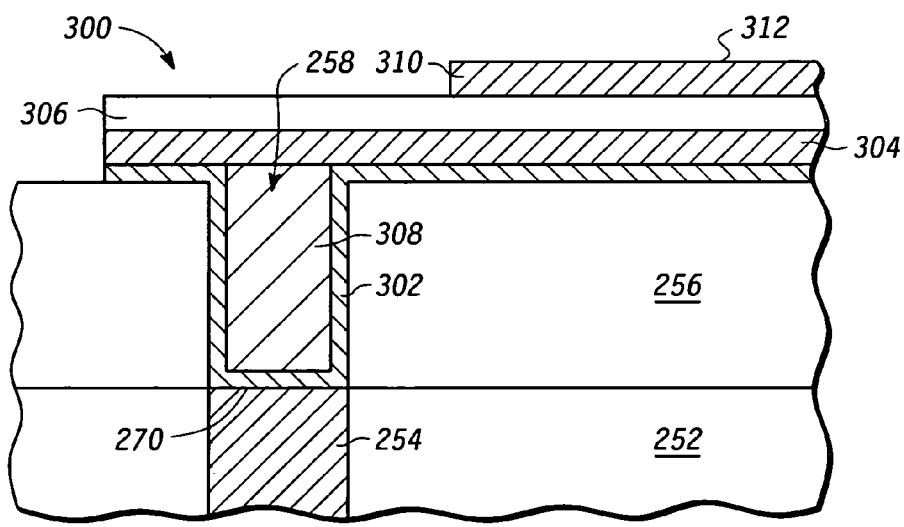
FIG. 14 is a cross sectional view of a metal-insulator-metal structure in accordance with another exemplary embodiment of the present invention.

FIG. 14 illustrates a MIM structure 300 in accordance with yet another embodiment of the invention. MIM structure 300 is similar to MIM structure 250, having a first dielectric material layer 252, or combination of dielectric material layers, within which has been formed a conductor 254. Second dielectric material layer 256 overlies first dielectric material layer 252. Via void space 258 is formed within second dielectric material layer 256 to expose surface 270 of conductor 254.

A barrier layer 302 may be deposited by blanket deposition within via void space 258 and overlying second dielectric material layer 256 to any suitable thickness. The barrier layer 302 may comprise any conductive material suitable for forming a barrier layer, such as, for example, tantalum (Ta), tantalum nitride (TaN), titanium (Ti), titanium nitride (TiN), tungsten (W), tungsten nitride (WN), or a combination of layers of such materials, such as layers of TaN and Ta. In addition, the barrier layer 302 may have any suitable thickness, which thickness may or may not be dependent on the material used to form barrier layer 302.

In one embodiment of the present invention, after deposition of barrier layer 302, a conductive fill material 308 may be deposited by blanket deposition to fill via void space 258. Conductive fill material 308 may comprise any suitable conductive material, such as copper or tungsten, so that conductive fill material 308 in via void space 258 functions as a conductor. After deposition of conductive fill material 308, any excess conductive fill material 308 overlying barrier layer 302 and second dielectric material layer 256 is removed by any suitable removal process, such as CMP, ECMP, etching and the like. As described with reference to barrier layer 40 of FIG. 4, barrier layer 302 serves as a stop layer for the removal process.

A first conductive electrode layer 304 then may be deposited by blanket deposition, followed by the blanket deposition of an insulating material layer 306 and a second conductive electrode layer 310. First and second conductive electrode layers 304 and 310 may comprise any suitable conductive material, such as those materials described above for the formation of conductive electrode material layer 266 of FIG. 13. Insulator material layer 306 may comprise any of the materials described above to form insulator material layer 264 of FIG. 13.

In another embodiment of the invention, via void space 258 is not filled with conductive fill material 308 but, rather, after deposition of barrier layer 302, first electrode layer 304 is deposited by blanket deposition overlying barrier layer 302 and within via void space 258. The deposition of first electrode layer 304 is followed by the deposition of insulating material layer 306 and the deposition of second electrode layer 310.

Second electrode layer 310 then may be patterned and etched using standard mask and etch techniques to form an electrode 312. Insulating material layer 306, first electrode layer 304, and barrier layer 302 also may be patterned and etched, simultaneously or separately, using standard mask and etch techniques. In a preferred embodiment of the invention, insulating material layer 306, first electrode layer 304, and barrier layer 302 are patterned and etched after formation of electrode 312. However, it will be understood that electrode 312 may be formed after the patterning and etching of insulating material layer 306, first electrode layer 304, and/or barrier layer 302, although it will be appreciated that the patterning and etching of insulating material layer 306, first electrode layer 304, and/or barrier layer 302 may include an initial, simultaneous patterning and etching of second electrode layer 310.

As illustrated in FIG. 14, first electrode layer 304, and optionally insulating material layer 306, may be etched to substantially cover via void space 258. In this regard, when via void space 258 is filled with conductive fill material 308, first electrode layer 304 may serve as a capping layer to minimize the diffusion of conductive fill material 308 from via void space 258 and also to protect the conductive fill material 308 from corrosive fluids that may be used in subsequent etching processes. Accordingly, in one embodiment of the invention, first electrode layer 304 completely covers conductive fill material 308 and extends sufficiently beyond via void space 258 to allow for any misalignments that may result during patterning or during subsequent etching processes. In another embodiment of the invention, when first electrode layer 304 does not serve as a capping layer, first electrode layer 304 may be patterned and etched so that it does not extend over via void space 258 or only partially extends over via void space 258.

Figure 15:
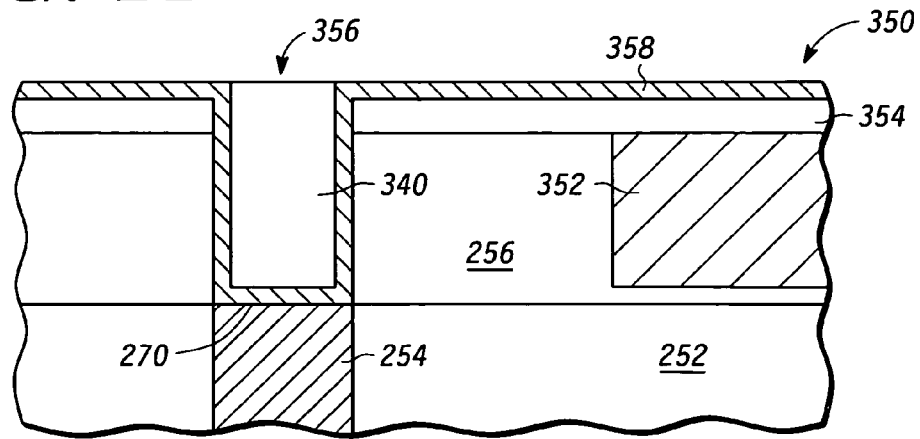
FIG. 15 is a cross sectional view of a metal-insulator-metal structure in accordance with a further exemplary embodiment of the present invention.

FIG. 15 illustrates a MIM structure 350 in accordance with yet another embodiment of the invention. MIM structure 350 is similar to MIM structure 250, having a first dielectric material layer 252, or combination of dielectric material layers, within which has been formed a conductor 254. Second dielectric material layer 256 overlies first dielectric material layer 252. A second conductor 352, such as, for example, a digit line or a bit line, is disposed within second dielectric material layer 256 such that second conductor 352 is perpendicular to the plane of FIG. 15. Second conductor 352 may be formed by any suitable conventional technique, such as, for example, a damascene process or a subtractive process. An insulating material layer 354 is deposited overlying second dielectric material layer 256 and second conductor 352. Void space 356 then is formed within second dielectric material layer 256 and insulating material layer 354 to expose a surface 270 of conductor 254. Void space 356 may have any suitable shape, such as, for example, a via shape or a trench shape.

A barrier layer 358 then may be deposited by blanket deposition within void space 356 and overlying insulating material layer 354. The barrier layer 358 may comprise any conductive material suitable for forming a barrier layer, such as, those materials described above to form barrier layer 302 of FIG. 14. In addition, the barrier layer 358 may have any suitable thickness, which thickness may or may not be dependent on the material used to form barrier layer 358. Accordingly, as illustrated in FIG. 15, conductor 352, insulating material layer 354, and barrier layer 358 form a metal-insulator-metal structure, with barrier layer 358 serving as an overlying or top electrode for MIM structure 350 while also electrically coupling MIM structure 350 to conductor 254.

In one embodiment of the invention, a fill material 340 then may be deposited by blanket deposition overlying barrier layer 358 to fill via void space 356. Fill material 340 may comprise any suitable material. In one embodiment of the invention, fill material 340 may comprise a conductive material, such as copper or tungsten, so that fill material 340 in via void spaces 356 functions as a conductor. In another embodiment of the invention, fill material 340 may be formed from a dielectric material, such as, for example, TEOS, high density plasma TEOS (HDPTEOS), boron phosphorus doped TEOS (BPTEOS), boron phosphorus silica glass (BPSG), spin-on-glass, plasma-enhanced nitride (PEN), fluorinated glass, hydrogen silsesquioxane, methyl silsesquioxane, silicon nitride, silicon dioxide, and the like, or combinations thereof. In yet another embodiment, fill material 340 may comprise any material that is deposited overlying barrier layer 358 to form another device structure (not shown).

After deposition of fill material 356, any excess fill material 356 overlying barrier layer 358 and insulating material layer 354 may be removed by any suitable removal process, such as CMP, ECMP, etching and the like. As described with reference to barrier layer 40 of FIG. 4, barrier layer 358 serves as a stop layer for the removal process.

Accordingly, magnetoresistive random access memory (MRAM) device structures, and methods for fabricating such structures, that utilize a barrier layer to provide for enhanced uniform spacing between a memory element and a digit line have been provided. In addition, semiconductor structures other than MRAM devices that exploit the presence of a barrier layer within a void space have been provided. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method for fabricating a magnetoelectronic memory element structure, the method comprising:

fabricating an interconnect stack in electrical communication with at least one transistor;

forming a digit line disposed at least partially within a first dielectric material layer, said first dielectric material layer overlying said interconnect stack;

etching a void space in said first dielectric material layer to expose said interconnect stack;

depositing a conductive barrier layer having a first portion and a second portion, said first portion of said conductive barrier layer overlying said digit line and said second portion of said conductive barrier layer disposed within said void space and in electrical communication with said interconnect stack;

forming a magnetic memory element layer overlying said first portion of said conductive barrier layer;

depositing an electrode layer overlying said magnetic memory element layer;

patterning and etching said electrode layer to form an electrode overlying said digit line; and patterning and etching said magnetic memory element layer wherein the step of patterning and etching said electrode layer to form an electrode overlying said digit line is performed before the step of and etching said magnetic memory element layer.

2. The method for fabricating a magnetoelectronic memory element structure of claim 1, the step of depositing said conductive barrier layer comprising the step of depositing a layer comprising at least one material selected from the group consisting of tantalum, tantalum nitride, titanium, titanium nitride, tungsten, and tungsten nitride.

3. The method for fabricating a magnetoelectronic memory element structure of claim 1, further comprising the step of depositing a fill material overlying said first portion and said second portion of said conductive barrier layer before the step of forming a magnetic memory element layer.

4. The method for fabricating a magnetoelectronic memory element structure of claim 3, further comprising the step of removing a portion of said fill material overlying said first portion of said conductive barrier layer before the step of forming a magnetic memory element layer.

5. The method for fabricating a magnetoelectronic memory element structure of claim 4, wherein the step of removing a portion of said fill material is performed by chemical mechanical polishing.

6. The method for fabricating a magnetoelectronic memory element structure of claim 3, wherein the step of depositing a fill material comprises the step of depositing a dielectric material.

7. The method for fabricating a magnetoelectronic memory element structure of claim 3, wherein the step of depositing a fill material comprises the step of depositing a conductive material.

8. The method for fabricating a magnetoelectronic memory element structure of claim 7, wherein the step of depositing a conductive material comprises the step of depositing copper.

9. The method for fabricating a magnetoelectronic memory element structure of claim 7, wherein the step of patterning and etching said magnetic memory element layer comprises the step of patterning and etching said magnetic memory element layer so that said magnetic memory element layer underlies said electrode and substantially overlies said fill material and said second portion of said conductive barrier layer.

10. The method for fabricating a magnetoelectronic memory element structure of claim 9, wherein the step of patterning and etching said magnetic memory element layer comprises the step of patterning and etching said magnetic memory element layer so that said magnetic memory element layer underlies said electrode, overlies said fill material and said second portion of said conductive barrier layer, and extends beyond said fill material and said second portion of said conductive barrier layer.

11. The method for fabricating a magnetoelectronic memory element structure of claim 1, the step of forming a magnetic memory element layer overlying said first portion of said conductive barrier layer further comprising the step of forming said magnetic memory element layer overlying said second portion of said conductive barrier layer and within said void space.

12. The method for fabricating a magnetoelectronic memory element structure of claim 11, the step of depositing an electrode layer overlying said magnetic memory element layer comprising the step of depositing said electrode layer within said void space.

13. The method for fabricating a magnetoelectronic memory element structure of claim 12, further comprising the step of removing a portion of said magnetic memory element layer and a portion of said electrode layer that overlie said first dielectric material and that do not overlie said digit line.

14. The method for fabricating a magnetoelectronic memory element structure of claim 13, wherein the step of removing said portion of said magnetic memory element layer and said portion of said electrode layer is performed by etching.

15. The method for fabricating a magnetoelectronic memory element structure of claim 1, further comprising the step of depositing a capping layer overlying said digit line after the step of forming said digit line.

16. The method for fabricating a magnetoelectronic memory element structure of claim 1, further comprising the step of depositing a second dielectric material layer overlying said digit line after the step of forming said digit line, said second dielectric material layer functioning as an etch stop during the step of patterning and etching said magnetic memory element layer.

* * * * *